US012486594B2

(12) United States Patent
Ryu et al.

(10) Patent No.: US 12,486,594 B2
(45) Date of Patent: Dec. 2, 2025

(54) INGOT PULLER APPARATUS THAT AXIALLY POSITION MAGNETIC POLES

(71) Applicant: GlobalWafers Co., Ltd., Hsinchu (TW)

(72) Inventors: JaeWoo Ryu, Chesterfield, MO (US); Carissima Marie Hudson, Saint Charles, MO (US); JunHwan Ji, Cheonan-si (KR); WooJin Yoon, Cheonan-si (KR)

(73) Assignee: GlobalWafers Co., Ltd., Hsinchu (TW)

( * ) Notice: Subject to any disclaimer, the term of this patent is extended or adjusted under 35 U.S.C. 154(b) by 553 days.

(21) Appl. No.: 17/897,685

(22) Filed: Aug. 29, 2022

(65) Prior Publication Data

US 2024/0068123 A1 Feb. 29, 2024

(51) Int. Cl.
*C30B 35/00* (2006.01)
*C30B 15/20* (2006.01)
*C30B 15/30* (2006.01)
*C30B 29/06* (2006.01)

(52) U.S. Cl.
CPC .............. *C30B 15/30* (2013.01); *C30B 15/20* (2013.01); *C30B 29/06* (2013.01)

(58) Field of Classification Search
CPC ......... C30B 15/00; C30B 15/20; C30B 15/22; C30B 15/30; C30B 29/00; C30B 29/02; C30B 29/06; C30B 35/00; C30B 35/005
USPC .......... 117/11, 13–15, 30, 32, 200–202, 206, 117/208, 218, 928, 931–932
See application file for complete search history.

(56) References Cited

U.S. PATENT DOCUMENTS

| | | | |
|---|---|---|---|
| 5,851,283 | A | 12/1998 | Hoshi et al. |
| 6,258,163 | B1 | 7/2001 | Kuragaki |
| 6,423,285 | B1 | 7/2002 | Itoi et al. |
| 6,984,264 | B2 | 1/2006 | Shimonosono et al. |
| 7,223,304 | B2 | 5/2007 | Lu |
| 7,611,580 | B2 | 11/2009 | Lu |
| 8,280,468 | B2 | 10/2012 | Takami et al. |
| 8,795,432 | B2 | 8/2014 | Furukawa |
| 2008/0060572 | A1 | 3/2008 | Fu et al. |
| 2008/0302294 | A1 | 12/2008 | Ohkubo |
| 2009/0114147 | A1 | 5/2009 | Cho et al. |
| 2009/0183670 | A1 | 7/2009 | Cho et al. |
| 2009/0320743 | A1 | 12/2009 | Sreedharamurthy et al. |

(Continued)

FOREIGN PATENT DOCUMENTS

| | | | |
|---|---|---|---|
| JP | 10182280 A | * | 7/1998 |
| JP | 2008214118 A | * | 9/2008 |

(Continued)

OTHER PUBLICATIONS

Machida et al., "The effects of argon gas flow rate and furnace pressure on oxygen concentration in Czochralski silicon single crystals grown in a transverse magnetic field", Journal of Crystal Growth 210 (2000), Nov. 27, 1997, pp. 532-540.

*Primary Examiner* — Kenneth A Bratland, Jr.
(74) *Attorney, Agent, or Firm* — Armstrong Teasdale LLP

(57) ABSTRACT

Methods for producing a silicon ingot in which a horizontal magnetic field is generated are disclosed. The magnet position is controlled in at least two stages of ingot growth. The magnetic poles may be at a first position during the first stage of ingot growth and lowered to a second position in a second stage of ingot growth. By controlling the magnet position, the crystal-melt interface shape may be relatively more consistent.

17 Claims, 12 Drawing Sheets

(56) References Cited

U.S. PATENT DOCUMENTS

| | | | |
|---|---|---|---|
| 2019/0161888 | A1 | 5/2019 | Masada |
| 2021/0180206 | A1 | 6/2021 | Ryu et al. |

FOREIGN PATENT DOCUMENTS

| | | | | |
|---|---|---|---|---|
| JP | 2010024120 | A | * | 2/2010 |
| WO | 2016167542 | A1 | | 10/2016 |

* cited by examiner

INGOT PULLER APPARATUS THAT AXIALLY POSITION MAGNETIC POLES

FIELD OF THE DISCLOSURE

The field of the disclosure relates to methods for producing single crystal silicon ingots in a horizontal magnetic field Czochralski process and related ingot puller apparatus for producing single crystal silicon ingots.

BACKGROUND

Single crystal silicon is the starting material in many processes for fabricating semiconductor electronic components and solar materials. For example, semiconductor wafers produced from silicon ingots are commonly used in the production of integrated circuit chips on which circuitry is printed. In the solar industry, single crystal silicon may be used instead of multicrystalline silicon due to the absence of grain boundaries and dislocations.

To produce semiconductor or solar wafers, a single crystal silicon ingot may be produced in a Czochralski process by dipping a seed crystal into molten silicon held within a crucible. The seed crystal is withdrawn in a manner sufficient to achieve the diameter desired for the ingot. After ingot formation, the silicon ingot is machined into a desired shape from which the semiconductor or solar wafers may be produced.

Polished silicon wafers that meet manufacturer requirements for lack of agglomerated point defects, e.g., crystal originated pits (COP), may be referred to as "Neutral Silicon" or "Perfect Silicon". Perfect Silicon wafers are preferred for many semiconductor applications as a lower cost polished wafer alternative to, for example, epitaxially deposited wafers. During growth of Perfect Silicon ingot in a horizontal magnetic field Czochralski process, the crystal-melt interface shape is typically concave. To produce Perfect Silicon, the thermal condition of the ingot or the crystal-melt interface shape is controlled while the pulling speed is regulated. The pull speed and the thermal condition (such as by adjusting the gap between the melt surface and the reflector and controlling the bottom heater) may be adjusted continuously to control the shape of the crystal-melt interface. The thermal condition changes during growth of the ingot which complicates control of the crystal-melt interface such that Perfect Silicon is produced only in an axial window of ingot growth.

A need exists for methods for controlling the horizontal magnetic field to maintain a relatively constant crystal-melt interface and ingot puller apparatus in which such methods may be carried out to produce single crystal silicon ingots (e.g., Perfect Silicon).

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for producing a silicon ingot. Polycrystalline silicon is melted in a crucible enclosed in a growth chamber to form a melt. The melt has a melt free surface. A horizontal magnetic field is generated within the growth chamber. A seed crystal is contacted with the melt. The seed crystal is withdrawn from the melt to form the silicon ingot. A position of a maximum gauss plane during formation of a constant diameter portion of the silicon ingot is regulated in at least two stages of ingot growth. The at least two stages includes a first stage and a second stage. The first stage corresponds to formation of the silicon ingot from a beginning of formation of the constant diameter portion of the silicon ingot up to an intermediate ingot length. The second stage corresponds to formation of the silicon ingot from at least the intermediate ingot length to a total length of the constant diameter portion. Regulating the position of the maximum gauss plane includes maintaining the position of the maximum gauss plane in the second stage at a position lower than the position of the maximum gauss plane during the first stage.

Another aspect of the present disclosure is directed to an ingot puller apparatus for manufacturing a single crystal silicon ingot. The ingot puller apparatus includes a crucible for holding a silicon melt. An ingot puller housing defines a growth chamber for pulling a silicon ingot from the silicon melt. The crucible is disposed within the growth chamber. A pair of magnetic poles are disposed radially outward from the crucible. The apparatus includes a translation device for moving the magnetic poles axially relative to the crucible.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Provisions of the present disclosure relate to methods for manipulating the ingot-melt interface shape during ingot growth (i.e., change the shape of the solidification front). The methods and apparatus of the present disclosure may involve changing the position of the maximum gauss plane during ingot growth to change the shape of the ingot-melt interface as the ingot is grown.

Figure 1:
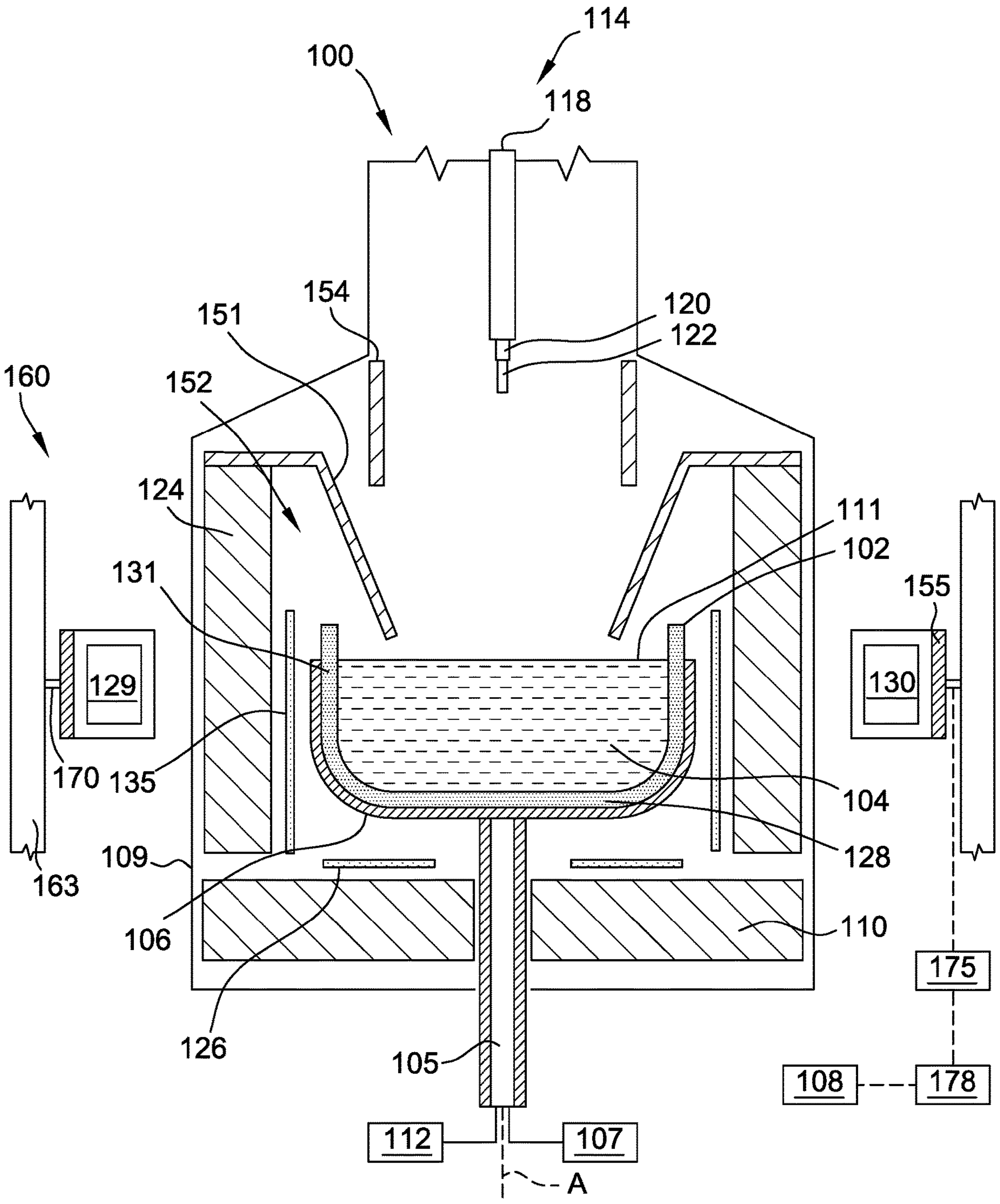
FIG. 1 is a cross-section of an HMCZ ingot puller apparatus before silicon ingot growth.

The methods of the present disclosure may generally be carried out in any ingot puller apparatus that is configured to pull a single crystal silicon ingot and in which a horizontal magnetic field is applied to the melt. An example ingot puller apparatus (or more simply "ingot puller") is indicated generally at "100" in FIG. 1. The ingot puller apparatus 100 includes a crucible 102 for holding a melt 104 of semiconductor or solar-grade material, such as silicon, supported by a susceptor 106. The ingot puller apparatus 100 includes a crystal puller housing 109 that defines a growth chamber 152 for pulling a silicon ingot 113 (FIG. 2) from the melt 104 along a pull axis A.

The crucible 102 includes a floor 128 and a sidewall 131 that extends upward from the floor 128. The sidewall 131 is generally vertical. The floor 128 includes the curved portion of the crucible 102 that extends below the sidewall 131. Within the crucible 102 is a silicon melt 104 having a melt surface 111.

In some embodiments, the crucible 102 is layered. For example, the crucible 102 may be made of a quartz base layer and a synthetic quartz liner disposed on the quartz base layer.

The susceptor 106 is supported by a shaft 105. The susceptor 106, crucible 102, shaft 105 and ingot 113 (FIG. 2) have a common longitudinal axis A or "pull axis" A.

A pulling mechanism 114 is provided within the ingot puller apparatus 100 for growing and pulling an ingot 113 from the melt 104. Pulling mechanism 114 includes a pulling cable 118, a seed holder or chuck 120 coupled to one end of the pulling cable 118, and a silicon seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the melt 104. The pulling mechanism 114 is operated to cause the seed crystal 122 to rise. This causes a single crystal ingot 113 (FIG. 2) to be withdrawn from the melt 104.

Figure 2:
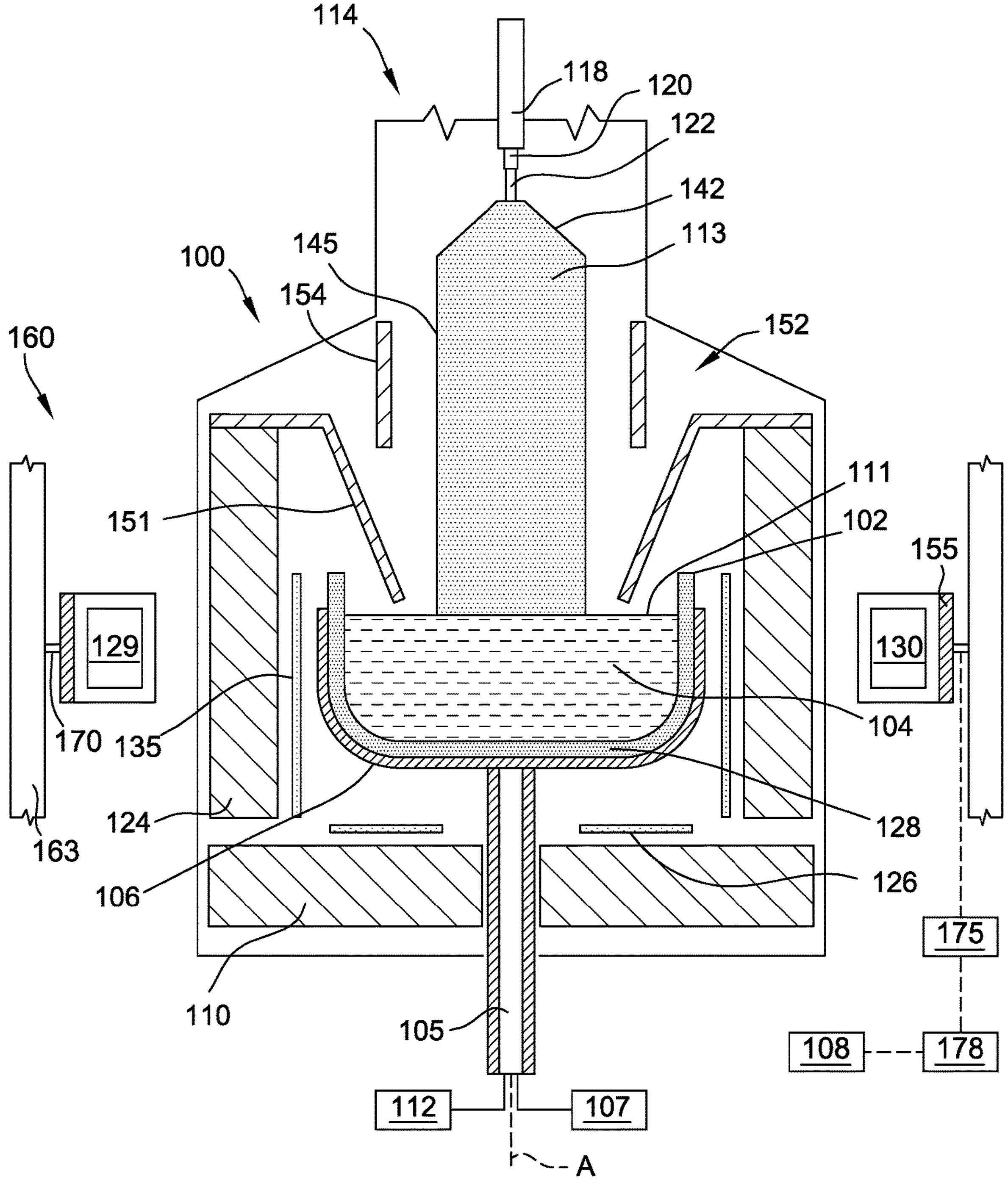
FIG. 2 is a cross-section of the HMCZ ingot puller apparatus of FIG. 1 during silicon ingot growth.

During heating and crystal pulling, a crucible drive unit 107 (e.g., a motor) rotates the crucible 102 and susceptor 106. A lift mechanism 112 raises and lowers the crucible 102 along the pull axis A during the growth process. For example, the crucible 102 may be at a lowest position (near the bottom heater 126) in which an initial charge of solid-phase polycrystalline silicon previously added to the crucible 102 is melted. Crystal growth commences by contacting the melt 104 with the seed crystal 122 and lifting the seed crystal 122 by the pulling mechanism 114. As the ingot grows, the silicon melt 104 is consumed and the height of the melt in the crucible 102 decreases. The crucible 102 and susceptor 106 may be raised to maintain the melt surface 111 at or near the same position relative to the ingot puller apparatus 100 (FIG. 2).

A crystal drive unit (not shown) may also rotate the pulling cable 118 and ingot 113 (FIG. 2) in a direction opposite the direction in which the crucible drive unit 107 rotates the crucible 102 (e.g., counter-rotation). In embodiments using iso-rotation, the crystal drive unit may rotate the pulling cable 118 in the same direction in which crucible drive unit 107 rotates the crucible 102. In addition, the crystal drive unit raises and lowers the ingot 113 relative to the melt surface 111 as desired during the growth process.

The ingot puller apparatus 100 may include an inert gas system to introduce and withdraw an inert gas such as argon from the growth chamber 152. The ingot puller apparatus 100 may also include a dopant feed system (not shown) for introducing dopant into the melt 104.

According to the Czochralski single crystal growth process, a quantity of polycrystalline silicon, or polysilicon, is charged to the crucible 102. The initial semiconductor or solar-grade material that is introduced into the crucible is melted by heat provided from one or more heating elements to form a silicon melt in the crucible. The ingot puller apparatus 100 includes bottom insulation 110 and side insulation 124 to retain heat in the puller apparatus. In the illustrated embodiment, the ingot puller apparatus 100 includes a bottom heater 126 disposed below the crucible floor 128. The crucible 102 may be moved to be in relatively close proximity to the bottom heater 126 to melt the polycrystalline charged to the crucible 102.

To form the ingot, the seed crystal 122 is contacted with the surface 111 of the melt 104. The pulling mechanism 114 is operated to pull the seed crystal 122 from the melt 104. Referring now to FIG. 2, the ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104.

The ingot puller apparatus 100 is configured to produce a cylindrical semiconductor ingot having an ingot diameter of 150 mm, greater than 150 mm, more specifically in a range from approximately 150 mm to 450 mm, and even more specifically, a diameter of approximately 300 mm. In other embodiments, ingot puller apparatus 100 is configured to produce a semiconductor ingot having a 200 mm ingot diameter or a 450 mm ingot diameter. In addition, in one embodiment, the apparatus 100 is configured to produce a semiconductor ingot with a total ingot length of at least 900 mm. In some embodiments, the system is configured to produce a semiconductor ingot with a length of 1950 mm, 2250 mm, 2350 mm, or longer than 2350 mm. In other embodiments, the ingot puller apparatus 100 is configured to produce a semiconductor ingot with a total ingot length ranging from approximately 900 mm to 1200 mm, between approximately 900 mm and approximately 2000 mm, or between approximately 900 mm and approximately 2500 mm. In some embodiments, the system is configured to produce a semiconductor ingot with a total ingot length greater than 2000 mm.

The ingot puller apparatus 100 includes a side heater 135 and a susceptor 106 that encircles the crucible 102 to maintain the temperature of the melt 104 during crystal growth. The side heater 135 is disposed radially outward to the crucible sidewall 131 as the crucible 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

The ingot puller apparatus 100 may include a heat shield 151. The heat shield 151 may shroud the ingot 113 and may be disposed within the crucible 102 during crystal growth (FIG. 2). The ingot puller apparatus 100 may be cooled such as by circulating cooling fluid through an outer chamber of the apparatus. A cooling jacket 154 is disposed within the growth chamber 152 for cooling the ingot 113.

The crystal growth processes of the present disclosure may be batch processes in which solid silicon is initially added to the crucible 102 to form a silicon melt without additional solid-silicon being added to the crucible 102 during crystal growth.

The ingot puller apparatus 100 of the present disclosure includes a pair of magnetic poles 129, 130 (FIG. 1) that generate a horizontal magnetic field during ingot growth. The magnetic poles 129, 130 are disposed radially outward from the crucible 102.

Figure 3:
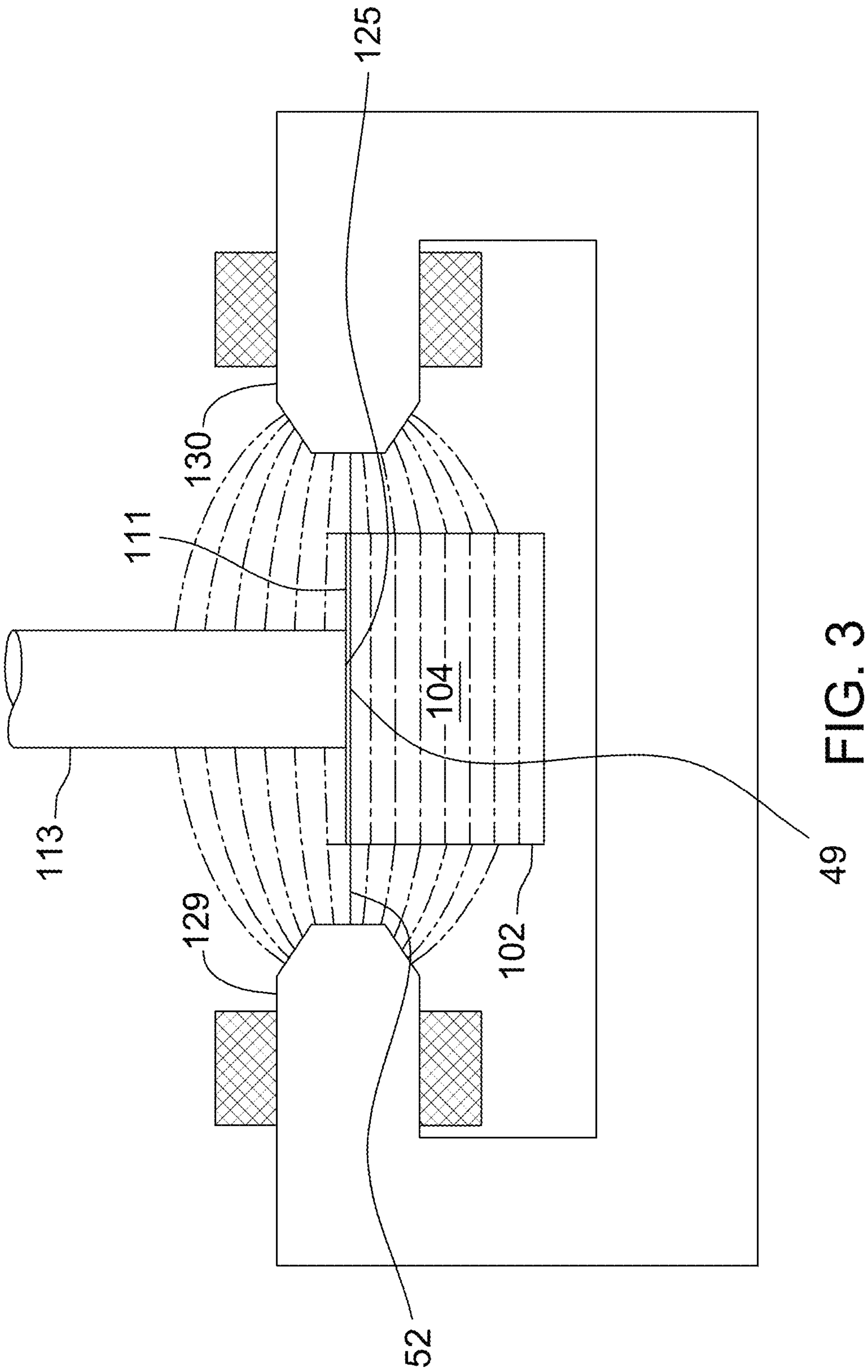
FIG. 3 is a schematic diagram illustrating a magnetic field applied to a crucible containing a melt in a crystal growing apparatus.

FIG. 3 is a diagram illustrating a horizontal magnetic field being applied to a crucible 102 containing a melt 104 from which an ingot 113 is grown. The transition between the melt and the ingot is generally referred to as the crystal-melt interface 125 (alternatively the "ingot-melt" or "solid-melt" interface) and is typically non-linear, for example concave, convex or gull-winged relative to the melt surface 111. The two magnetic poles 129, 130 are placed in opposition to generate a magnetic field generally perpendicular to the ingot-growth direction and generally parallel to the melt surface 111. The magnetic poles 129, 130 may be a conventional electromagnet, a superconductor electromagnet, or any other suitable magnet for producing a horizontal magnetic field of the desired strength. Application of a horizontal magnetic field gives rise to Lorentz force along the axial direction, in a direction opposite of fluid motion, opposing forces driving melt convection. The convection in the melt is thus suppressed, and the axial temperature gradient in the ingot near the interface increases. The melt-ingot interface then moves upward to the ingot side to accommodate the increased axial temperature gradient in the ingot near the interface and the contribution from the melt convection in the crucible decreases. The horizontal configuration has the advantage of efficiency in damping a convective flow at the melt surface 111.

The magnetic poles 129, 130 may be cooled by circulating cooling fluid through the poles 129, 130. A ferrous shield 155 (FIG. 1) may surround the magnetic poles 129, 130 to reduce stray magnetic fields and to enhance the strength of the field produced.

In accordance with embodiments of the present disclosure, a position of the maximum gauss plane ("MGP") during formation of a constant diameter portion of the silicon ingot is regulated in at least two stages of ingot growth. The MGP is characterized by the maximum magnitude of the horizontal component of the magnetic field and a zero vertical component along the MGP The position of the magnetic poles 129, 130 relative to the melt free surface 111 (or more simply "melt surface") is changed during ingot growth by moving the magnetic poles 129, 130.

Figure 4:
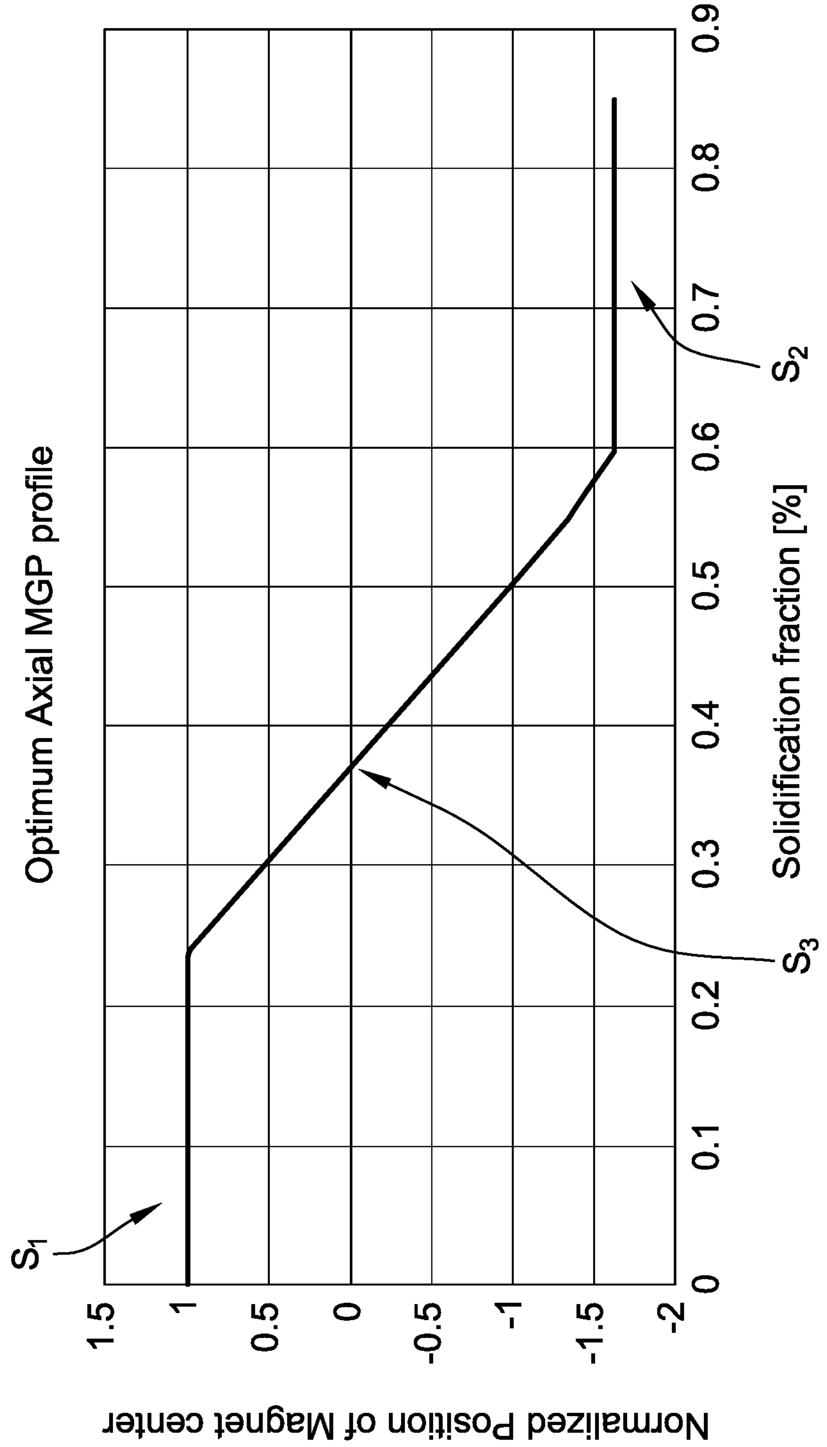
FIG. 4 is an embodiment of the MGP position profile during HMCZ ingot growth.

Referring now to FIG. 4 in which an example profile of the position of MGP during ingot growth is shown, the position of the MGP is regulated in a first stage $S_1$ that corresponds to formation of the silicon ingot from the beginning of formation of the constant diameter portion of the silicon ingot up to an intermediate ingot length and a second stage $S_2$ that corresponds to formation of the silicon ingot from at least the intermediate ingot length to the total length of the constant diameter portion. As shown in FIG. 4, regulating the position of the maximum gauss plane includes maintaining the position of the maximum gauss plane in the second stage $S_2$ at a position lower than the position of the maximum gauss plane during the first stage $S_1$. For example, the position of the maximum gauss plane during the first stage $S_1$ is maintained to be above the melt free surface. The position of the maximum gauss plane during the second stage $S_2$ is maintained to be below the melt free surface.

In the embodiment of FIG. 4, the MGP profile includes an intermediate stage $S_3$ that corresponds to formation of the silicon ingot between the first stage $S_1$ and the second stage $S_2$. Regulating the position of the maximum gauss plane may include lowering the position of the maximum gauss plane from the position in the first stage $S_1$ to the position in the second stage $S_2$ during the intermediate stage $S_3$.

In some embodiments, the position of the maximum gauss plane (corresponding to normalized position "1" in FIG. 4) is maintained at a position at least 20 mm above the melt free surface during the first stage or, as in other embodiments, at least 40 mm above the melt free surface, at least 60 mm above the melt free surface, from the melt free surface to 150 mm above the melt free surface, from 20 mm above the melt free surface to 150 mm above the melt free surface, or from 40 mm above the melt free surface to 150 mm above the melt free surface during the first stage.

Alternatively or in addition, the position of the maximum gauss plane may be maintained below the melt free surface during the second stage or at a position at least 20 mm below the melt free surface during the second stage. In some embodiments, the position of the maximum gauss plane is maintained at a position at least 40 mm below the melt free surface during the second stage, at least 60 mm below the melt free surface, at least 80 mm below the melt free surface, at least 100 mm below the melt free surface, from the melt free surface to 200 mm below the melt free surface, from 20 mm below the melt free surface to 200 mm below the melt free surface, or from 20 mm below the melt free surface to 150 mm below the melt free surface.

In some embodiments and as shown in FIG. 4, MGP may be further from the melt free surface in the second stage $S_2$ than in the first stage $S_1$ (i.e., the absolute distance is more in the second stage). The ratio of (1) the distance from MGP to the melt free surface in the second stage $S_2$ to (2) the distance from MGP to the melt free surface in the first stage $S_1$ may be at least 1.0, at least 1.25, at least 1.4, or at least 1.5.

In the embodiment of FIG. 4, the position of the maximum gauss plane is lowered below the melt free surface during the intermediate stage $S_3$. The position of the maximum gauss plane may be lowered in the intermediate stage $S_3$ (i.e., between the end of $S_1$ and the start of $S_2$) at least 40 mm (or lowered at least 75 mm, at least 100 mm or at least 150 mm) over no more than 60% of the constant diameter portion or, as in other embodiments, no more than 50% or no more than 40% of the constant diameter portion.

The crucible 102 may move as the melt 104 is consumed to maintain a relatively constant position of the melt interface. In some embodiments, the position of the magnetic poles 129, 130 relative to the melt free surface 111 may be adjusted by moving both the magnetic poles 129, 130 and the position of the melt free surface 111 (such as allowing melt to be consumed or by moving the crucible 102). In other embodiments, the position of the magnetic poles 129, 130 relative to the melt free surface 111 is adjusted only by moving the magnetic poles 129, 130 (i.e., the melt free surface 111 is maintained at a relatively constant position by moving the crucible 102 as the melt 104 is consumed).

The length of the first stage $S_1$ may be at least 10% of the constant diameter portion or, as in other embodiments, at least 20% of the constant diameter portion, at least 10% and less than 50% of the constant diameter portion, or to at least 10% and less than 40% of the constant diameter portion. The first stage $S_1$ may begin at the start of the constant diameter portion of the ingot. The position of the maximum gauss plane may be maintained to be constant during the first stage $S_1$ or may vary during the first stage.

The length of the second stage $S_2$ may be at least 10% of the length of the constant diameter portion or, as in other embodiments, at least 20% of the constant diameter portion, at least 30% of the constant diameter portion, at least 10% and less than 50% of the constant diameter portion, or to at least 20% and less than 50% of the constant diameter portion. The second stage $S_2$ may extend from the end of the first stage $S_1$ (or the end of the intermediate stage $S_3$ in embodiments having an intermediate stage) to the end of the constant diameter portion of the ingot. The position of the maximum gauss plane may be maintained to be constant during the second stage $S_2$ or may vary during the second stage.

The magnetic poles 129, 130 may be operated at any power(s) that enables ingot growth to proceed consistent as described herein. For example, during the first, second and intermeddle stages of ingot growth, the horizontal magnetic field may be generated at a magnetic flux strength of less than 0.4 Tesla or, as in other embodiments, less than 0.35 Tesla, less than 0.3 Tesla, less than 0.25 Tesla or from about 0.2 Tesla to about 0.4 Tesla. Generally, the strength of the magnetic field is its magnitude at the center 49 of the maximum gauss plane 52.

The crucible 102 may be rotated in a direction opposite at which the ingot 113 is rotated with the crucible 102 being rotated at a rate in a range from 0.1 RPM to 5.0 RPM (i.e., −0.1 RPM to −5.0 RPM) or even from 0.1 RPM to 1.6 RPM (i.e., −0.1 RPM to −1.6 RPM) or from 0.1 RPM to 1.2 RPM (i.e., −0.1 RPM to −1.2 RPM). In other embodiments, the crucible 102 is rotated in the same direction at which the ingot 113 is rotated with the crucible 102 being rotated at a rate in a range from 0.1 RPM to 5.0 RPM, from 0.7 RPM to 5 RPM, or from 1.2 RPM to 5.0 RPM.

The ingot puller apparatus 100 includes a translation device 160 (FIG. 1) for moving the magnetic poles 129, 130 axially relative to the crucible 102 and melt free surface 111. Any translation device 160 for moving the magnetic poles 129, 130 that allows the ingot puller apparatus 100 to operate as described herein may be used. For example, the translation device 160 may include a guide 163 and a mount 170 for moving each magnetic pole 129, 130 relative to the guide 163. The guide 163 may include one or more rails with the mount 170 connecting each magnetic pole 129, 130 to the one or more rails. The ingot puller apparatus 100 includes an actuator 175 for moving the magnetic poles 129, 130 relative to the guide 163. For example, the actuator 175 may be a pneumatic or hydraulic cylinder, a rack and pinion, a pulley, or a gear train with a ball screw. A motor 178 may power the actuator 175. The motor 178 may be controlled by a controller 108. Alternatively, the translation device 160 may include other apparatus or devices that regulate movement of the magnetic poles 129, 130.

Figure 5:
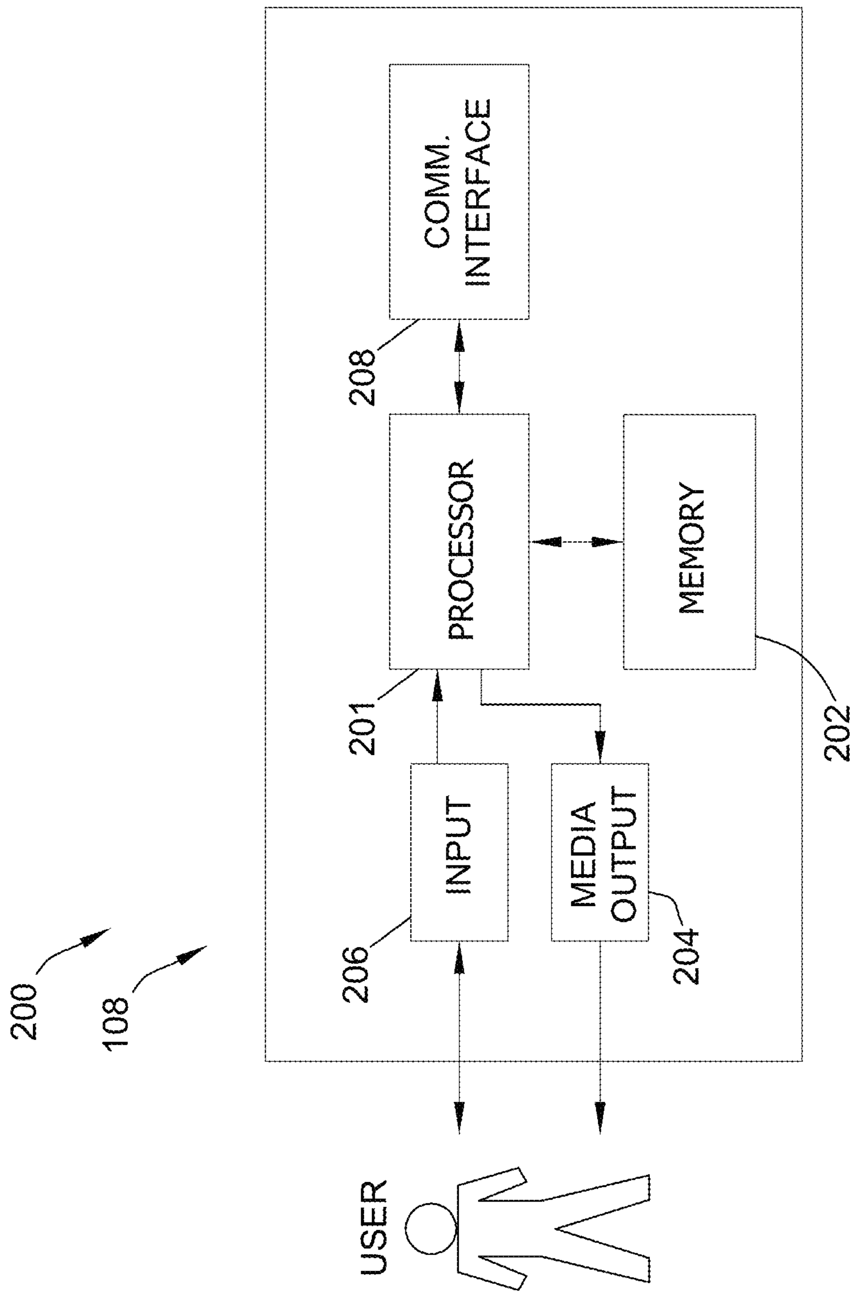
FIG. 5 is a block diagram of an example controller for use in the ingot puller apparatus shown in FIG. 1.

FIG. 5 is a block diagram of an example computing device 200 that may be used as, or included as part of, the controller 108 that regulates the position of the magnetic poles 129, 130. The computing device 200 includes a processor 201, a memory 202, a media output component 204, an input device 206, and a communications interface 208. Other embodiments include different components, additional components, and/or do not include all components shown in FIG. 5.

The processor 201 is configured for executing instructions. In some embodiments, executable instructions are stored in the memory 202. The processor 201 may include one or more processing units (e.g., in a multi-core configuration). The term processor, as used herein, refers to central processing units, microprocessors, microcontrollers, reduced instruction set circuits (RISC), application specific integrated circuits (ASIC), a programmable logic circuit (PLC), and any other circuit or processor capable of executing the functions described herein. The above are examples only, and are thus not intended to limit in any way the definition and/or meaning of the term "processor."

The memory 202 stores non-transitory, computer-readable instructions for performance of the techniques described herein. Such instructions, when executed by the processor 201, cause the processor 201 to perform at least a portion of the methods described herein. That is, the instructions stored in the memory 202 configure the controller 108 to perform the methods described herein. In some embodiments, the memory 202 stores computer-readable instructions for providing a user interface to the user via media output component 204 and, receiving and processing input from input device 206. The memory 202 may include, but is not limited to, random access memory (RAM) such as dynamic RAM (DRAM) or static RAM (SRAM), read-only memory (ROM), erasable programmable read-only memory (EPROM), electrically erasable programmable read-only memory (EEPROM), and non-volatile RAM (NVRAM). Although illustrated as separate from the processor 201, in some embodiments the memory 202 is combined with the processor 201, such as in a microcontroller or microprocessor, but may still be referred to separately. The above memory types are example only, and are thus not limiting as to the types of memory usable for storage of a computer program.\

The media output component 204 is configured for presenting information to a user (e.g., an operator of the system). The media output component 204 is any component capable of conveying information to the user. In some embodiments, the media output component 204 includes an output adapter such as a video adapter and/or an audio adapter. The output adapter is operatively connected to the processor 201 and operatively connectable to an output device such as a display device (e.g., a liquid crystal display (LCD), light emitting diode (LED) display, organic light emitting diode (OLED) display, cathode ray tube (CRT), "electronic ink" display, one or more light emitting diodes (LEDs)) or an audio output device (e.g., a speaker or headphones).

The computing device 200 includes, or is connected to, the input device 206 for receiving input from the user. The input device 206 is any device that permits the computing device 200 to receive analog and/or digital commands, instructions, or other inputs from the user, including visual, audio, touch, button presses, stylus taps, etc. The input device 206 may include, for example, a variable resistor, an input dial, a keyboard/keypad, a pointing device, a mouse, a stylus, a touch sensitive panel (e.g., a touch pad or a touch screen), a gyroscope, an accelerometer, a position detector, an audio input device, or any combination thereof. A single component such as a touch screen may function as both an output device of the media output component 204 and the input device 206.

The communication interface 208 enables the computing device 200 to communicate with remote devices and systems, such as the motor 178 or actuator 175, remote sensors, remote databases, remote computing devices, and the like, and may include more than one communication interface for interacting with more than one remote device or system. The communication interfaces may be wired or wireless communications interfaces that permit the computing device 200 to communicate with the remote devices and systems directly or via a network. Wireless communication interfaces may include a radio frequency (RF) transceiver, a Bluetooth® adapter, a Wi-Fi transceiver, a ZigBee® transceiver, a near field communication (NFC) transceiver, an infrared (IR) transceiver, and/or any other device and communication protocol for wireless communication. (Bluetooth is a registered trademark of Bluetooth Special Interest Group of Kirkland, Washington; ZigBee is a registered trademark of the ZigBee Alliance of San Ramon, California.) Wired communication interfaces may use any suitable wired communication protocol for direct communication including, without limitation, USB, RS232, I2C, SPI, analog, and proprietary I/O protocols. In some embodiments, the wired communication interfaces include a wired network adapter allowing the computing device 200 to be coupled to a network, such as the Internet, a local area network (LAN), a wide area network (WAN), a mesh network, and/or any other network to communicate with remote devices and systems via the network.

The computer systems discussed herein may include additional, less, or alternate functionality, including that discussed elsewhere herein. The computer systems discussed herein may include or be implemented via computer-executable instructions stored on non-transitory computer-readable media or medium.

The non-transitory memory 202 stores instructions that are executed by the processor 201 to configure the controller 108. In accordance with embodiments of the present disclosure, the controller 108 is configured to cause the translation device 160 to move the pair of magnetic poles 129, 130 to regulate a position of the maximum gauss plane during formation of a constant diameter portion of the silicon ingot in accordance with the embodiments described above. For example, the position of the maximum gauss plane may be regulated in the at least two stages of ingot growth with the position of the maximum gauss plane in the second stage being a position lower than the position of the maximum gauss plane during the first stage. The controller 108 may be configured to maintain the position of the maximum gauss plane in the at least two stages (and also including the optional intermediate stage) at the distances from the melt free surface in the embodiments described above. The controller 108 may be configured to maintain the position of the maximum gauss plane such that the various lengths of the first and second stages and the rate at which the magnet is lowered in the intermediate stage as described above may be achieved.

The controller 108 may be triggered to change the position of the magnetic poles in the various stages of ingot growth (e.g., to terminate the first stage and move to the intermediate stage or terminate the intermediate stage and move to the second stage) by the weight of the melt, the length of the ingot or by a timed control.

Compared to conventional methods and apparatus for producing single crystal silicon, the methods and apparatus of embodiments of the present disclosure have several advantages. By moving the magnetic poles during HMCZ ingot growth, the shape of the crystal-melt interface may be maintained relatively constant. The magnet positions may be controlled to reduce the crystal-melt interface height which reduces variation in the axial gradient for v/G control during production of Perfect Silicon, thereby increasing the Perfect Silicon window. The magnet positions may be controlled to reduce seed end oxygen. The crystal-melt interface may be maintained relatively constant regardless of the melt volume and the position of the crucible. Use of higher MGP at the seed end enables lower seed end oxygen due to less oxygen incorporation into the body. Ramping down the magnet position in middle to late body pushes up the crystal-melt interface similar to the seed end portion of the crystal without impacting Oi. Accordingly, critical v/G increases at the middle to late body and a higher pull rate is used to produce perfect silicon which increases productivity. Constant or less variation in axial v/G results in less quality loss and improves yield. Increased crystal-melt interface height (i.e., more concave) results in increased pull speed and increased productivity. Oxygen control at the seed end results in flexibility of oxygen control at the seed end (either high $O_i$ (negative MGP) or lower $O_i$ (positive MGP) as chosen by the customer).

EXAMPLES

The processes of the present disclosure are further illustrated by the following Examples. These Examples should not be viewed in a limiting sense.

Example 1: Effect of MGP Position on Interface Shape and Ingot Growth

Figure 6:
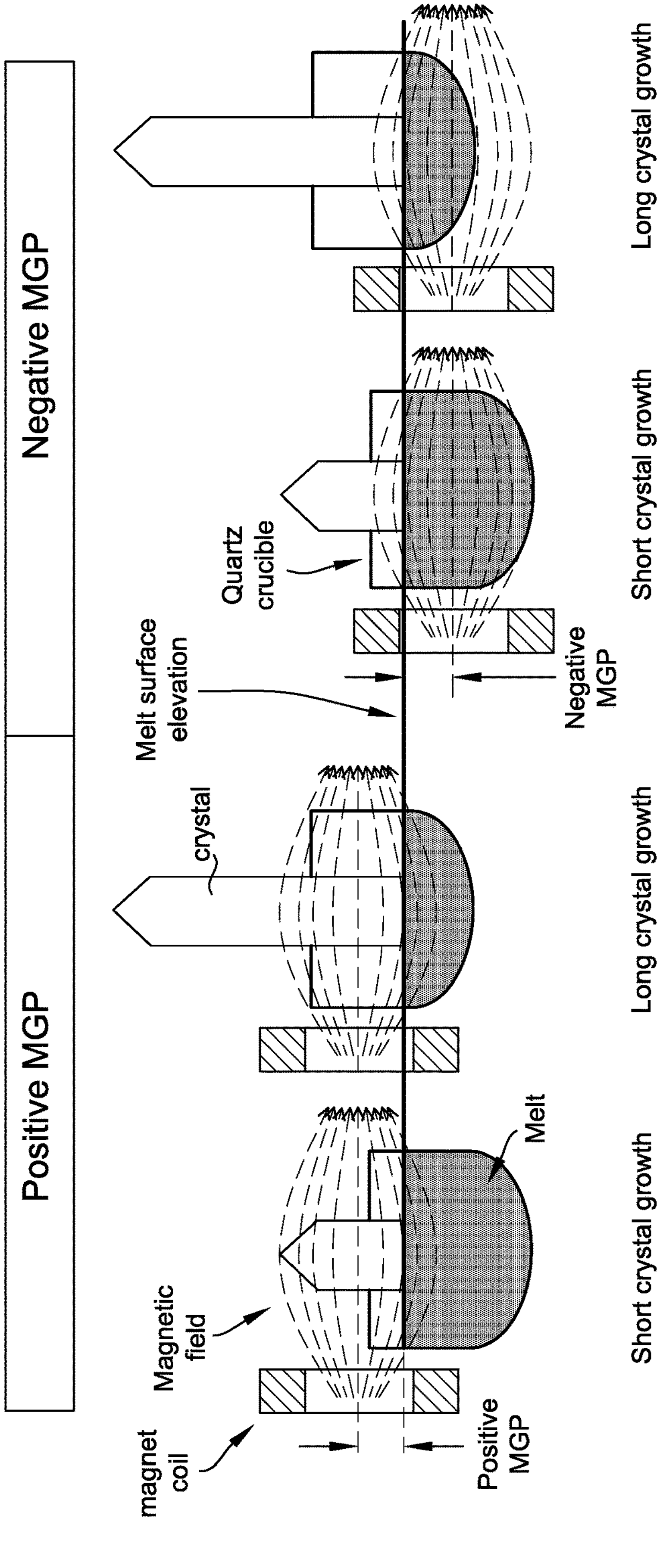
FIG. 6 is a schematic of the magnet and silicon melt at two different crystal lengths and magnet positions.

As shown in FIG. 6, in the case of short crystal growth lengths (i.e., larger melt volume), a positive MGP has more effect on the melt flow directly below the melt free surface whereas in the case of negative MGP, the effect on melt flow is towards the crucible bottom. This causes the flow velocity of positive MGP to be relatively slower than that of negative MGP, which means higher oxygen evaporation at the melt free surface. Since the strength of the magnetic field is similar at the crystal-melt interface, the crystal-melt interface would be similar.

With increasing crystal length, the flow velocity at the melt free surface is similar for both MGP conditions so the dissolution and evaporation of oxygen is similar. However, the crystal-melt interface shape may be different due to the different magnetic field directions and lines in the melt below the center.

Figure 7:
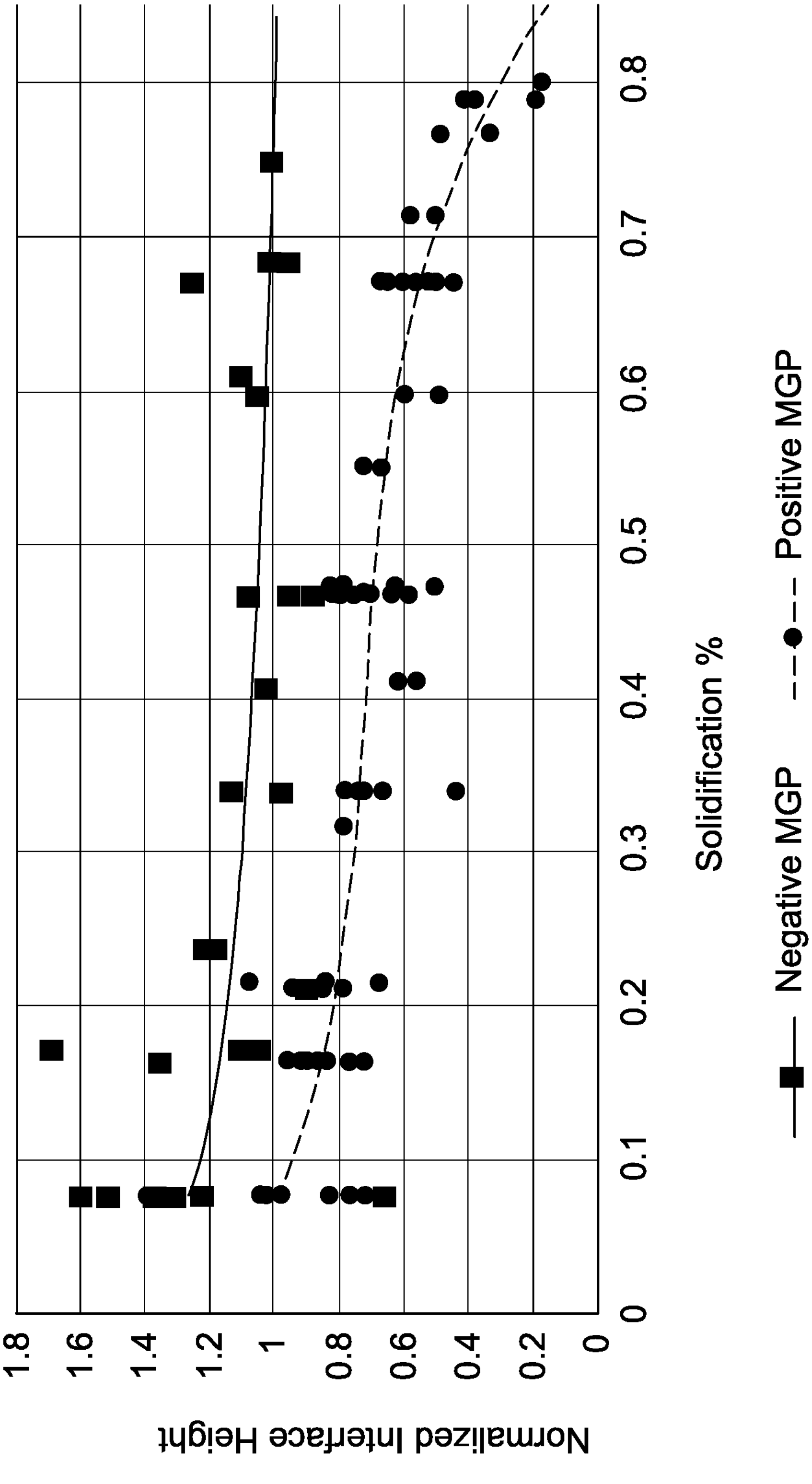
FIG. 7 is a graph showing the normalized interface height as a function of the percentage solidification of the ingot.

The typical height of the crystal-melt interface varies by the melt depth for both positive MGP and negative MGP as shown in FIG. 7. In case of positive MGP (i.e., maximum gauss plane is located above the melt free surface), the crystal-melt interface is pushed up into the growing crystal front at the larger melt depths and the force to push up the interface is gradually reduced with decreasing melt volume. Meanwhile, negative MGP maintains a force to push up the crystal-melt interface regardless of the melt volume which enables a relatively constant axial crystal-melt interface height regardless of melt depth.

Figure 8:
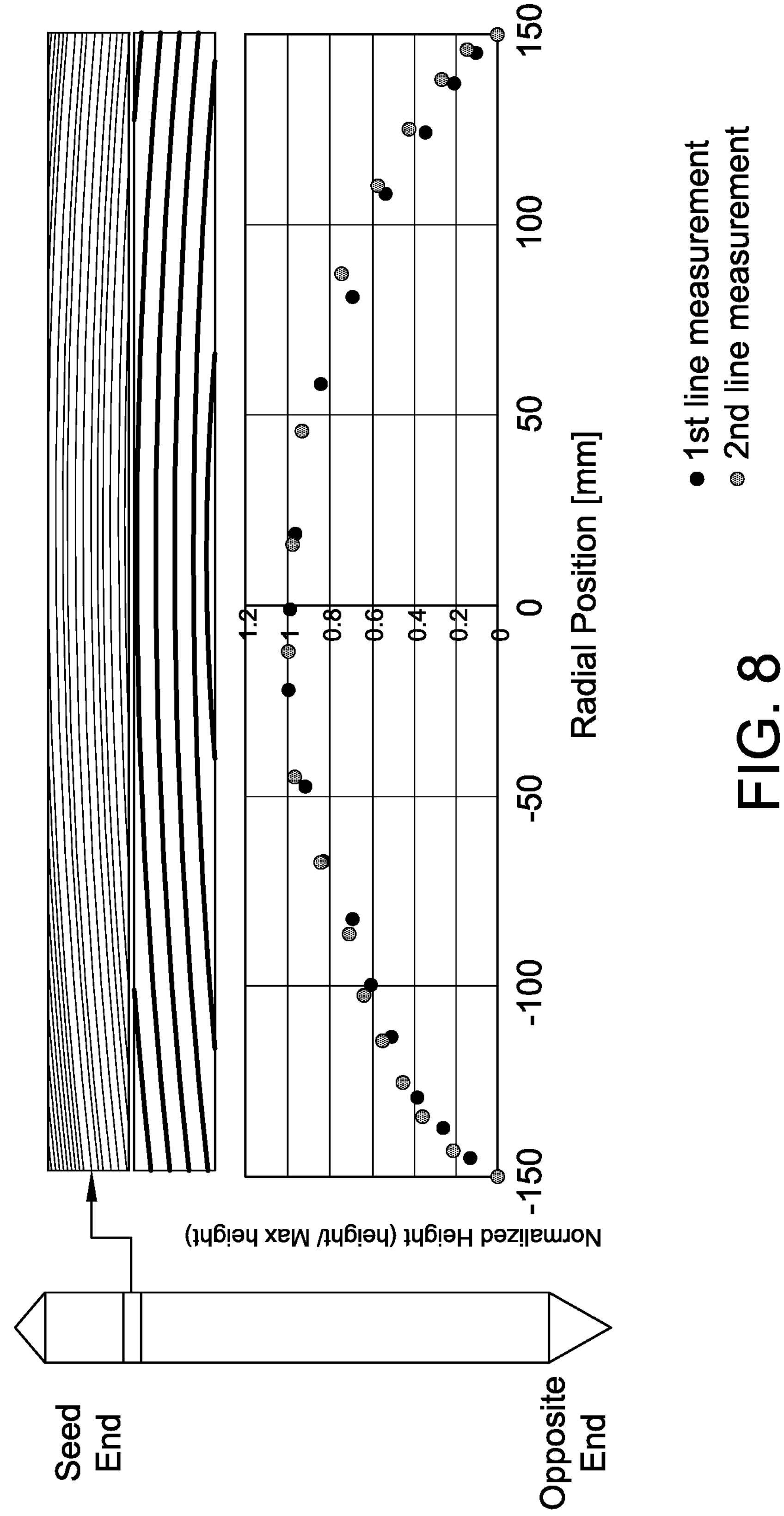
FIG. 8 shows the lifetime contour map of a vertical slab and the measured crystal-melt interface.

FIG. 8 shows the lifetime contour map of a vertical slab and the measured crystal-melt interface. A short slab was taken at specific crystal positions and given a heat treatment to delineate the striations of its solidification history. Then, the x-y coordinate of the image from lifetime contour mapping was produced. The height of the interface is directly inferred by the difference in center to edge from the contour map.

Figure 9:
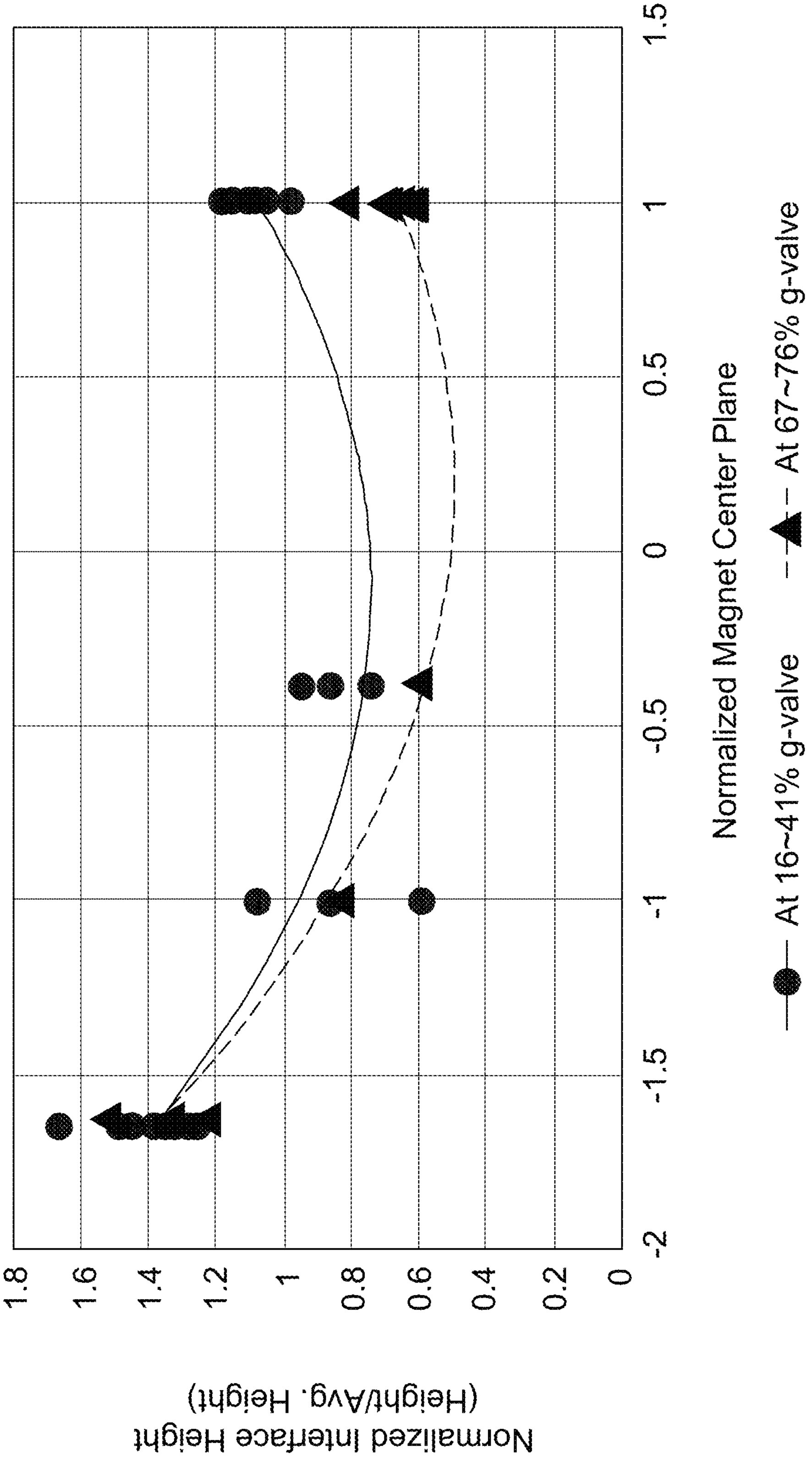
FIG. 9 shows the normalized height of the crystal-melt interface as a function of MGP at different crystal positions.

The height of the crystal-melt interface as a function of MGP was plotted in FIG. 9. As shown in FIG. 9, the height of the crystal-melt interface was similar at both the seed end and opposite end in case of negative MGP, thereby fixing one parameter used for axial v/G Perfect Silicon control.

Figure 10:
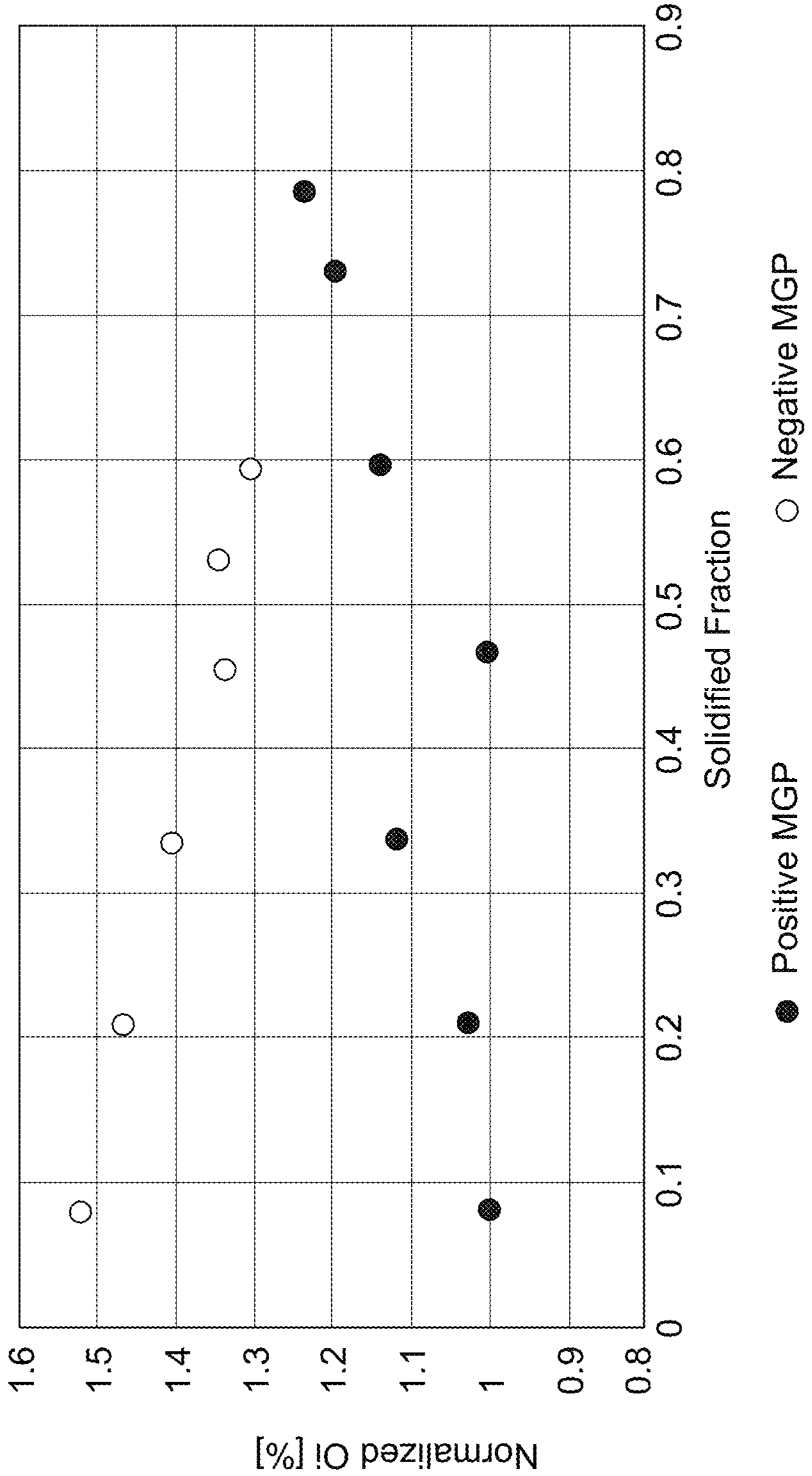
FIG. 10 shows the axial $O_i$ profile with two different MGP positions (normalized Oi=[Oi/lowest Oi])

FIG. 10 shows an example of the axial oxygen profile at different MGP positions. The $O_i$ difference between positive and negative MGP gradually decreased with decreasing melt volume due to the magnetic field in the melt area. Low $O_i$ from positive MGP in the early body was caused by the magnetic field being near the melt free surface, thereby enhancing evaporation. As shown in FIG. 10, increasing the ratio of the area between the free melt surface and the wet surface of the crucible mitigates the effect of MGP difference.

Figure 11:
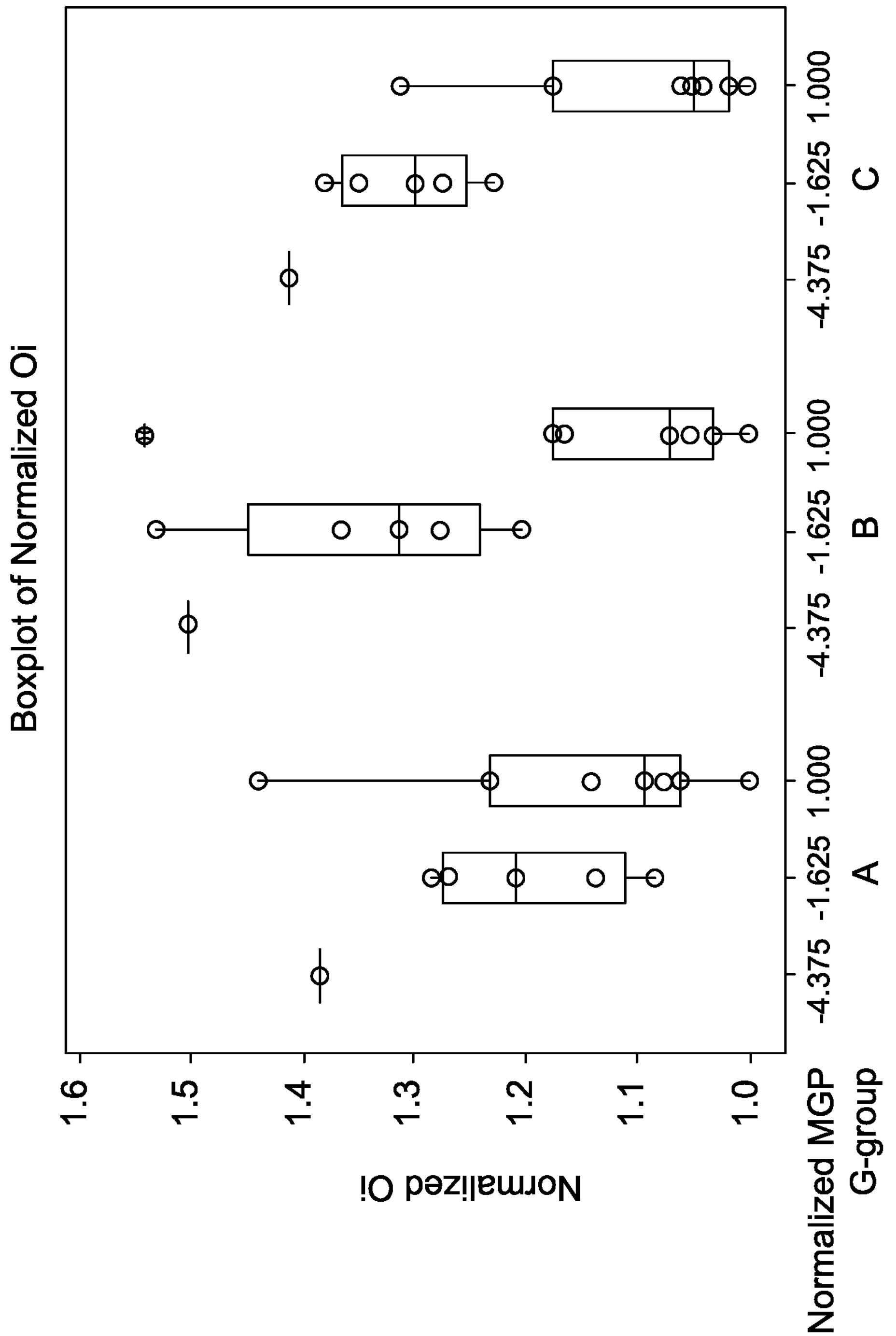
FIG. 11 is a boxplot of normalized $O_i$ at three different normalized MGP values.

FIG. 11 is a boxplot of normalized $O_i$ at three different normalized MGP values. FIG. 11 shows that Oi increases by lowering the magnet position at three different conditions of melt volume. Group A includes Oi data from less than 9% of the solidified ingot, Group B includes Oi data from 9% of 22% of the solidified ingot, and Group C includes $O_i$ data from 22% to 33.6% of the solidified ingot.

To achieve a lower Oi specification, a higher magnet position may be used for both $O_i$ and interface height. However, as explained above, a lower magnet position may be used for better interface control. As shown in FIG. 10, $O_i$ in the late body growth is not sensitive to the magnet position.

Figure 12:
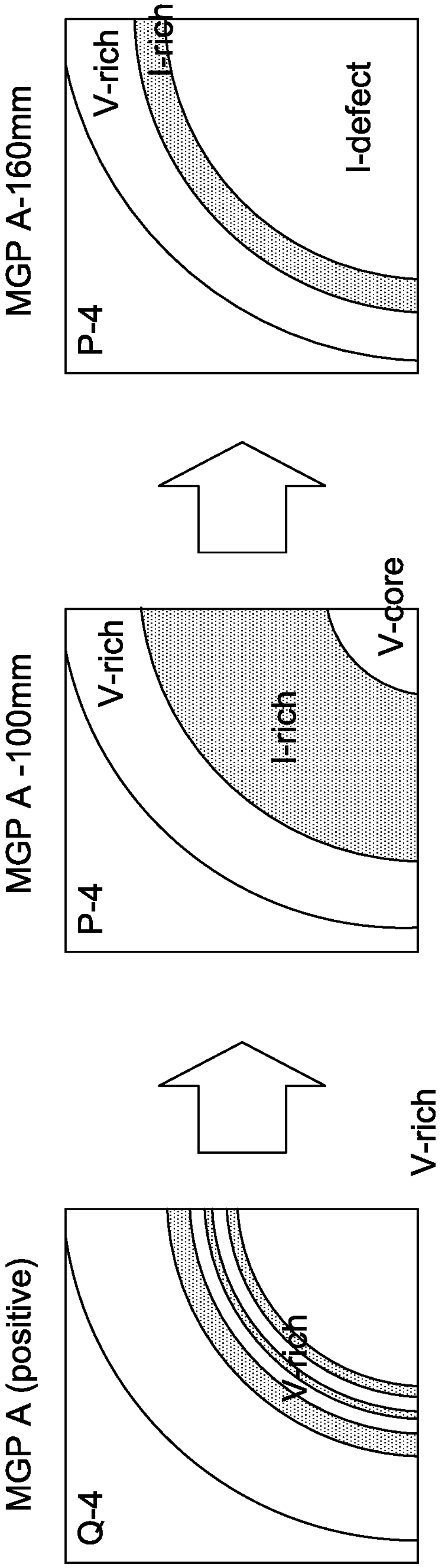
FIG. 12 is an example of the crystal defect pattern at three different magnet positions.

FIG. 12 shows the effects of lowering the magnet position on the defects profile. The crystal defect changes from vacancy rich perfect silicon (Pv) to dislocation cluster (I-defect). In addition, the radial defect pattern changes. The crystal center becomes vacancy dominant at positive MGP. By lowering the magnet position, the dominant point defect at the crystal center changes to interstitial dominant. This transition is caused by the changed interface with constant temperature at the crystal surface. The v/G at the crystal center increases and the crystal edge maintains the v/G the same as at high MGP, so the defects in the crystal center turns to I-defect at the same pull speed condition with different MGP.

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. An ingot puller apparatus for manufacturing a single crystal silicon ingot, the ingot puller apparatus comprising:
- a crucible for holding a silicon melt;
- an ingot puller housing that defines a growth chamber for pulling a silicon ingot from the silicon melt, the crucible being disposed within the growth chamber;
- a pair of magnetic poles disposed radially outward from the crucible;
- a translation device comprising a guide for moving the magnetic poles axially relative to the crucible; and
- a controller including a processor and a non-transitory memory storing instructions executed by the processor to configure the controller, the controller configured to cause the translation device to move the pair of magnetic poles to regulate a position of a maximum gauss plane during formation of a constant diameter portion of the silicon ingot in at least two stages of ingot growth, the at least two stages comprising:
  - a first stage corresponding to formation of the silicon ingot from a beginning of formation of the constant diameter portion of the silicon ingot up to an intermediate ingot length; and
  - a second stage corresponding to formation of the silicon ingot from at least the intermediate ingot length to a total ingot length; and
- wherein the controller is configured to maintain the position of the maximum gauss plane in the second stage at a position lower than the position of the maximum gauss plane during the first stage, the position of the maximum gauss plane being maintained at a position at least 100 mm below a melt free surface during the second stage.

2. The ingot puller apparatus as set forth in claim 1 wherein the translation device comprises a mount for moving each magnetic pole relative to the guide.

3. The ingot puller apparatus as set forth in claim 2 wherein the guide comprises a rail and the mount connects each magnetic pole to the rail.

4. The ingot puller apparatus as set forth in claim 2 comprising an actuator for moving the magnetic poles relative to the guide.

5. The ingot puller apparatus as set forth in claim 4 wherein the actuator comprises a pneumatic or hydraulic cylinder, a rack and pinion, a pulley or gear train with a ball screw.

6. The ingot puller apparatus as set forth in claim 4 comprising a motor for powering the actuator.

7. The ingot puller apparatus as set forth in claim 1 wherein the controller is configured to maintain the position of the maximum gauss plane at least 20 mm above the melt free surface during the first stage.

8. The ingot puller apparatus as set forth in claim 1 wherein the controller is configured to maintain the position of the maximum gauss plane at least 40 mm above the melt free surface during the first stage.

9. The ingot puller apparatus as set forth in claim 1 wherein the controller is configured to maintain the position of the maximum gauss plane at least 20 mm below the melt free surface during the second stage.

10. The ingot puller apparatus as set forth in claim 1 wherein the controller is configured to maintain the position of the maximum gauss plane at least 40 mm below the melt free surface during the second stage.

11. The ingot puller apparatus as set forth in claim 1 wherein the at least two stages comprise an intermediate stage that corresponds to formation of the silicon ingot between the first stage and the second stage, wherein the controller is configured to lower the position of the maximum gauss plane from the position in the first stage to the position in the second stage during the intermediate stage, and wherein the controller is configured to lower the maximum gauss plane below the melt free surface during the intermediate stage.

12. The ingot puller apparatus as set forth in claim 1 wherein the at least two stages comprise an intermediate stage that corresponds to formation of the silicon ingot between the first stage and the second stage, wherein the controller is configured to lower the position of the maximum gauss plane from the position in the first stage to the position in the second stage during the intermediate stage, and wherein the controller is configured to lower the maximum gauss plane at least 40 mm over no more than 60% of the constant diameter portion.

13. The ingot puller apparatus as set forth in claim 1 wherein the at least two stages comprise an intermediate stage that corresponds to formation of the silicon ingot between the first stage and the second stage, wherein the controller is configured to lower the position of the maximum gauss plane from the position in the first stage to the position in the second stage during the intermediate stage, and wherein the controller is configured to lower the maximum gauss plane at least 75 mm over no more than 50% of the constant diameter portion.

14. The ingot puller apparatus as set forth in claim 1 wherein the at least two stages comprise an intermediate stage that corresponds to formation of the silicon ingot between the first stage and the second stage, wherein the controller is configured to lower the position of the maximum gauss plane from the position in the first stage to the position in the second stage during the intermediate stage, and wherein the controller is configured to lower the maximum gauss plane at least 100 mm over no more than 40% of the constant diameter portion.

15. The ingot puller apparatus as set forth in claim 1 wherein the at least two stages comprise an intermediate stage that corresponds to formation of the silicon ingot between the first stage and the second stage, wherein the controller is configured to lower the position of the maximum gauss plane from the position in the first stage to the position in the second stage during the intermediate stage, and wherein the controller is configured to lower the maximum gauss plane at least 150 mm over no more than 60% of the constant diameter portion.

16. The ingot puller apparatus as set forth in claim 1 wherein the controller is configured to maintain a length of the first stage to be at least 10% and less than 50% of the constant diameter portion.

17. The ingot puller apparatus as set forth in claim 1 wherein the controller is configured to maintain a length of the second stage to be at least 10% and less than 50% of the constant diameter portion.

* * * * *